United States Patent [19]

Rosler et al.

[11] 4,232,063

[45] Nov. 4, 1980

[54] CHEMICAL VAPOR DEPOSITION REACTOR AND PROCESS

[75] Inventors: Richard S. Rosler, Saratoga; Robert W. East, San Jose, both of Calif.

[73] Assignee: Applied Materials, Inc., Santa Clara, Calif.

[21] Appl. No.: 960,594

[22] Filed: Nov. 14, 1978

Related U.S. Application Data

[63] Continuation of Ser. No. 773,974, Mar. 3, 1977, abandoned.

[51] Int. Cl.³ .................... B05D 5/12; B05C 13/00
[52] U.S. Cl. ................................ 427/94; 427/95; 427/255.3; 118/728; 118/725
[58] Field of Search .............. 118/49, 48, 49.1, 49.5, 118/725, 728; 427/94, 95, 86, 248, 255.3; 156/610, 611, 612, 613

[56] References Cited

U.S. PATENT DOCUMENTS

| 3,222,217 | 12/1965 | Grabmaier | 118/49.5 |
| 3,573,096 | 3/1971 | Tombs | 427/94 |
| 4,018,183 | 4/1977 | Meuleman | 118/49 |
| 4,018,184 | 4/1977 | Nagasawa et al. | 118/49.5 |
| 4,082,865 | 4/1978 | Ban et al. | 427/86 |
| 4,098,923 | 7/1978 | Alberti et al. | 118/49 |
| 4,108,106 | 8/1978 | Dozier | 118/49 |

Primary Examiner—Ralph S. Kendall
Attorney, Agent, or Firm—Flehr, Hohbach, Test, Albritton & Herbert

[57] ABSTRACT

Apparatus and process for depositing materials such as $Si_3N_4$ and $SiO_2$ on semiconductor wafers in a hot-wall reactor. A perforated distribution tube is positioned in the reaction chamber, and the wafers are placed inside the tube. Reactant gases are introduced into the chamber outside the tube and pass to the wafers through the openings in the tube.

7 Claims, 1 Drawing Figure

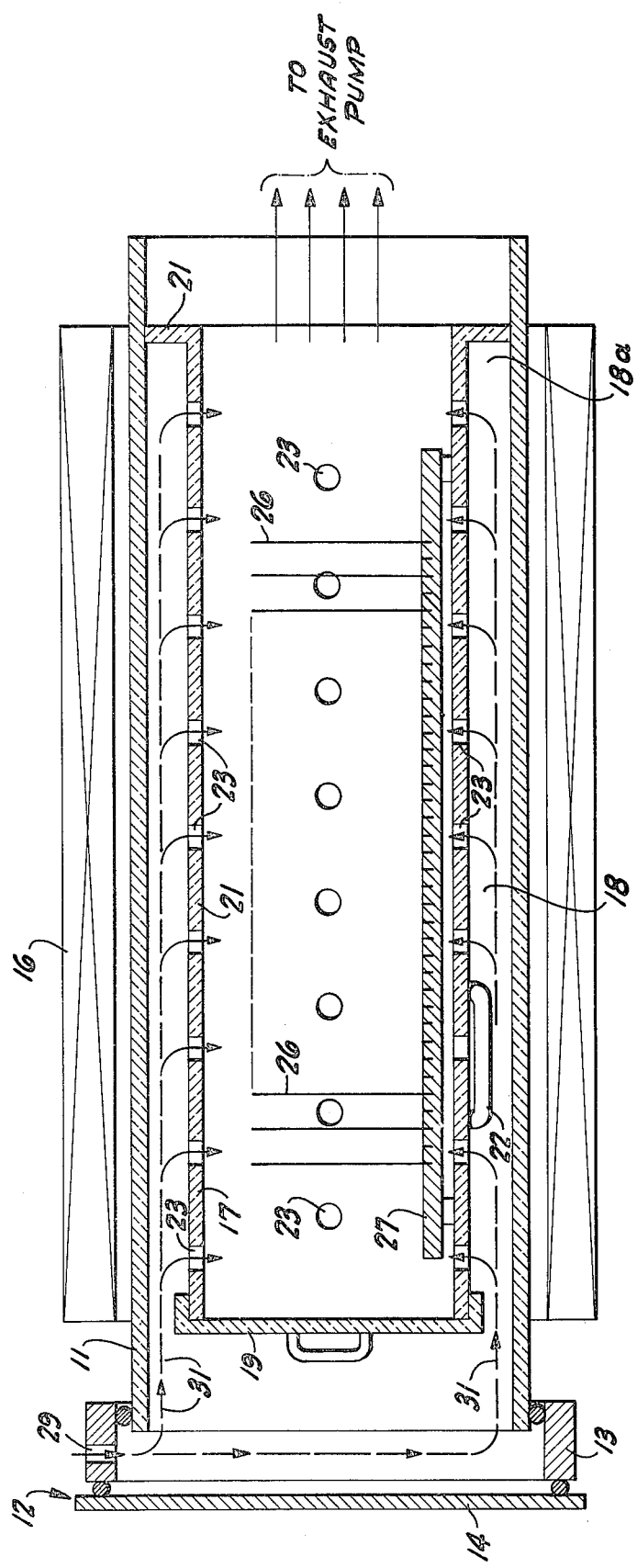

CHEMICAL VAPOR DEPOSITION REACTOR AND PROCESS

This is a continuation, of application Ser. No. 773,974 filed Mar. 3, 1977, now abandoned.

BACKGROUND OF THE INVENTION

This invention pertains generally to vapor deposition of films on substrates and more particularly to a reactor and process suitable for depositing materials such as $Si_3N_4$ and $SiO_2$ on semiconductor wafers.

Heretofore, silicon compounds have been deposited on semiconductor wafers in hot-wall reactors which commonly include an elongated tube defining a reaction chamber and an electrical resistance heater surrounding the tube for heating wafers in the chamber. Reactant gases flow through the chamber in an axial direction, and the wafers are positioned with their major surfaces perpendicular to the direction of gas flow.

With certain reactions, the films deposited in such reactors exhibit substantial nonuniformities both within individual wafers and from wafer to wafer. Such nonuniformities occur, for example, in the following reactions for depositing $Si_3N_4$ and $SiO_2$:

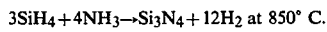

$3SiH_4 + 4NH_3 \rightarrow Si_3N_4 + 12H_2$ at 850° C.

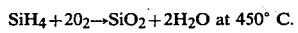

$SiH_4 + 2O_2 \rightarrow SiO_2 + 2H_2O$ at 450° C.

With these reactions and the hot-wall reactors of the prior art, the film deposited on a wafer can be as much as 50–500% thicker toward the edges than toward the center, and the films deposited on downstream wafers can be as much as 3–100% thinner than the films deposited on wafers located closer to the gas source.

There have been attempts to improve the uniformity of the deposited films by adjustment of the spacing between the edges of the wafers and the side wall of the reactor tube and the spacing between adjacent wafers. While such attempts have sometimes resulted in more uniform films on individual wafers, they tend to accentuate the variations from wafer to wafer.

SUMMARY AND OBJECTS OF THE INVENTION

In the reactor and process of the invention, a perforated distribution tube is positioned within the reactor tube, and the wafers are placed inside the distribution tube. Reactant gases are introduced into the region between the side walls of the tubes and pass to the wafers through the openings in the distribution tube, resulting in coatings which are substantially uniform in individual wafers and from wafer to wafer.

It is in general an object of the invention to provide a new and improved chemical vapor deposition reactor and process.

Another object of the invention is to provide a reactor and process of the above character for depositing uniform films on semiconductor wafers.

Another object of the invention is to provide a reactor and process of the above character in which the wafers are placed in a perforated distribution tube within the reaction chamber.

Additional objects and features of the invention will be apparent from the following description in which the preferred embodiments are set forth in conjunction with the accompanying drawing.

BRIEF DESCRIPTION OF THE DRAWING

The FIGURE is a largely schematic longitudinal section view of one embodiment of a chemical vapor deposition reactor incorporating the invention.

DESCRIPTION OF THE PREFERRED EMBODIMENTS

While the reactor structure is shown in generally schematic fashion in the drawing, it is intended to be enclosed in a surrounding enclosure (not shown) in and on which the necessary gaseous reactant flow controls, electrical power sources, and other attendant mechanisms are intended to be housed and mounted. For purposes of clarity of illustration, only those portions of the reactor necessary to illustrate the inventive concepts disclosed herein have been shown in the drawing. The portions of the reactor which are illustrated can be supported within the enclosure in any suitable fashion.

The reactor includes a generally cylindrical reactor tube 11 fabricated of a suitable material such as quartz. The tube is closed at one end by an end cap assembly 12 comprising a mounting ring 13 affixed to the tube and an end plate 14 removably mounted on the ring. A resistance heating coil 16 surrounds the reactor tube and is connected to a source of electrical energy to provide means for uniformly heating wafers placed in the reaction chamber formed inside the tube.

A perforated distribution tube 17 is disposed coaxially within reactor tube 11, and a plenum chamber 18 is formed between the side walls of the tubes. The distribution tube is closed at one end by a removable cover 19 and open at the other end. This tube is maintained in its coaxial position by a radial flange 21 at the open end and by legs 22 resting upon the side wall of the reactor tube toward the closed end. As illustrated, flange 21 engages the side wall of the reactor tube and forms a closure at the end 18a of the plenum chamber.

The distribution tube is formed of a suitable material such as quartz and includes a plurality of axially spaced apart openings 23. In the embodiment illustrated, the openings are arranged in four longitudinally extending rows spaced in quadrature about the periphery of the tube, with the openings in adjacent rows being staggered or offset axially.

A plurality of wafers 26 are mounted in a rack or boat 27 inside distribution tube 17. The wafers are spaced axially apart and oriented with their major surfaces perpendicular to the axis of the tube.

Means is provided for introducing reactant gases into the reaction chamber. This means includes an inlet passageway 29 formed in the mounting ring of end cap assembly 12 and connected to a suitable gas source (not shown). The open end of distribution tube 17 is connected to a suitable exhaust pump (not shown).

In the preferred embodiment, the inside diameter of distribution tube 17 is chosen to be only slightly greater than the diameter of wafers 26, and the spacing between adjacent wafers is equal to or greater than the distance between the edges of the wafers and the inner wall of the tube. For 3 inch wafers, for example, the tube would have an inside diameter on the order of 3½ inches, and the spacing between adjacent wafers would be on the order of ⅜ to 9/16 inch. This spacing has been found to give particularly satisfactory results from the standpoint of uniform film deposition across the entire surface area of each wafer.

In one preferred embodiment, the distribution tube is on the order of 51 inches long and includes four axial rows of eight ¼ inch diameter openings spaced on 4 inch centers.

Operation and use of the reactor and therein the process of the invention are as follows. Initially, the reactor and distribution tubes are opened by removing end plate 14 and cover 19, and the wafers to be coated are loaded into boat 27 externally of the reactor. The loaded boat is then placed inside the distribution tube, and the cover and end plate are replaced to close the tubes. The exhaust pump is then actuated to reduce the pressure in the chamber to the desired level. Heating coil 16 is energized continuously to heat the boat and wafers upon insertion into the reactor and to maintain them at the desired temperature during the reaction.

The reactant gas is introduced into the reactor through passageway 29. The gas flows around the outside of the distribution tube, as indicated by arrows 31, and passes through openings 23 to the interior of tube 17. The gas is removed from the open end of the distribution tube by the exhaust pump. The gas passing through openings 23 continuously replenishes the reactant gas with unreacted species, thereby assuring a uniform distribution of gas and the deposition of uniform coatings throughout the length of the reactor.

Although the invention be utilized in a wide variety of depositions, it is particularly suitable for depositing $Si_3N_4$ and $SiO_2$ on doped or undoped silicon wafers in the following reactions:

$$3SiH_4 + 4NH_3 \rightarrow Si_3N_4 + 12H_2 \text{ at } 800°-900° \text{ C.}$$

$$SiH_4 + 2O_2 \rightarrow SiO_2 + 2H_2O \text{ at } 350°-500° \text{ C.}$$

The following examples serve to illustrate the advantages of the invention in carrying out such reactions. Example 1 pertains to the deposition of $Si_3N_4$ on silicon wafers without a distribution tube, and Example 2 pertains to the same reaction utilizing the distribution tube. Examples 3 and 4 pertain to the deposition of $SiO_2$ on silicon wafers, the distribution tube being used only in Example 4.

EXAMPLE 1

40 wafers of 76 mm diameter were loaded on quartz wafer carrier at a spacing of 14.3 mm. The loaded carrier was inserted directly into a quartz reaction tube of 130 mm internal diameter maintained at a uniform temperature of 852° C., with no distribution tube. A reactant gas stream of 1200 sccm ammonia and 20 sccm silane was introduced into the reaction tube. The pressure upstream of the wafer carrier was maintained at 0.27 torr by an external vacuum pump. A film of silicon nitride was deposited on the wafers over 60 minutes. The film thickness at the center of a wafer at the inlet end of the carrier was 750 Å, a wafer at the center of the carrier had a film of 450 Å and a wafer at the exhaust end of the carrier, 350 Å. The total variation in the film thickness measured at the wafer centers was ±39%. The average film thickness variation within a wafer was ±60% with the film thickness near the wafer edge typically thicker than at the wafer center.

EXAMPLE 2

The conditions of Example 1 were repeated with the exception that the loaded wafer carrier was placed within a distribution tube of 90 mm internal diameter and then into the quartz reaction tube. The same inlet gas flows were established except that the reactor pressure upstream of the distribution tube was maintained at 0.5 torr. Over a 60 minute deposition period, a $Si_3N_4$ film of 900 Å thickness was deposited at the center of a wafer near the inlet, a film of 750 Å on the center wafer and a film of 500 Å on the wafer at the exhaust end of the wafer carrier. The variation in film thickness at the wafer centers was less than ±30% over all wafers. The variation in film thickness within a wafer ranged from less than ±3% to less than ±5%.

EXAMPLE 3

41 wafers of 76 mm diameter were placed vertically on a quartz wafer carrier with a wafer-to-wafer spacing of 14.3 mm. The loaded carrier was placed at the center of a heated quartz tube of 130 mm inside diameter, with no distribution tube between the reactor tube and wafers. The tube was maintained at a uniform temperature of 450° C. A reactant gas stream of 2400 sccm nitrogen, 100 sccm oxygen and 50 sccm silane was introduced into the quartz reaction tube. The pressure within the tube upstream of the wafers was maintained at 0.54 torr by an externally located vacuum pump attached to the exhaust end of the reaction tube. $SiO_2$ was deposited on the wafers at an average rate of 95 Å per minute for 25 minutes. The deposited $SiO_2$ film on a wafer at the inlet side of the carrier was found to be 3100 Å in thickness at the wafer center. The sixth wafer from the front of the carrier had a deposited film of 2000 Å in thickness; the film on the last wafer in the carrier was 2000 Å in thickness. The variation in film thickness on a wafer was found to be large. Typically the film within 12 mm of the edge of the wafer was twice the thickness at the wafer center.

EXAMPLE 4

56 wafers of 76 mm diameter were placed vertically on a quartz wafer carrier at a wafer-to-wafer spacing of 9.5 mm. The carrier was placed in a distribution tube of 90 mm inside diameter. The loaded distribution tube was then placed into heated quartz reaction tube of 130 mm inside diameter maintained at a temperature of 453.5°±3.5° C. A reactant gas stream of 2500 sccm nitrogen, 120 sccm oxygen and 50 sccm silane was introduced into the inlet of the reaction tube. The pressure within the tube upstream of the distribution tube was maintained at 1.0 torr by an external vacuum pump. $SiO_2$ was deposited on the wafers at an average rate of 52 Å per minute for 45 minutes. The deposited film thickness measured at the wafer centers was between 2300 Å and 2400 Å on all wafers. The variation in film thickness on the wafers was equal to or less than ±5%.

The invention has a number of important features and advantages. It enables uniform films to be deposited with reactions which could not be implemented successfully in hot-wall reactors of the prior art. The coating is substantially uniform within each wafer, from wafer to wafer and from run to run. This enables large batches of wafers to be processed economically. In addition, wafers of different diameters can be processed simply by changing the distribution tube.

It is apparent from the foregoing that a new and improved chemical vapor deposition reactor and process have been provided. While only the presently preferred embodiments have been described, as will be apparent to those familiar with the art, certain changes and modifications can be made without departing from the scope of the invention as defined by the following claims.

What is claimed is:

1. In a process for forming films of relatively uniform thickness on a plurality of generally planar wafers in a reaction chamber having an elongated distribution tube of slightly greater diameter than the wafers with a plurality of axially spaced openings formed therein, the steps of:
   A. placing the wafers in the distribution tube with the wafers spaced axially along the tube so that the major surfaces of the wafers are generally perpendicular to the axis of the tube and the spacing between adjacent ones of the wafers is at least as great as the distance between the edges of the wafers and the side wall of the distribution tube;
   B. introducing a reactant gas into the chamber outside the tube with the pressure within the chamber at a subatmospheric level; and
   C. permitting the gas to pass through the openings in the tube to the wafers for a time sufficient to deposit a layer of predetermined thickness on the wafers.

2. The process of claim 1 wherein the reactant gas is introduced into the chamber toward one end of the distribution tube.

3. The process of claim 1 wherein the material deposited is $Si_3N_4$, the reactant gas includes $SiH_4$ and $NH_3$, and the $Si_3N_4$ is deposited at a temperature on the order of 800° C. to 900° C.

4. The process of claim 1 wherein the material deposited is $SiO_2$, the reactant gas includes $SiH_4$ and $O_2$, and the $SiO_2$ is deposited at a temperature on the order of 350° C. to 500° C.

5. In apparatus for forming films of relatively uniform thickness on a plurality of generally planar wafers:
   A. a generally cylindrical reactor tube defining a reaction chamber;
   B. a distribution tube disposed within the reactor tube and spaced therefrom to form a plenum chamber between the side walls of the tubes, the distribution tube having a slightly greater diameter than the wafers and a plurality of axially spaced openings formed in its side wall to provide communication between the plenum chamber and the interior of the distribution tube;
   C. means for holding the wafers in an axially spaced relationship inside the distribution tube with the major surfaces of the wafers generally perpendicular to the axis and the spacing between adjacent ones of the wafers being at least as great as the distance between the edges of the wafers and the side wall of the distribution tube;
   D. a resistance heating coil positioned coaxially about the reactor tube;
   E. means for introducing a reactant gas into the plenum chamber toward one end thereof; and
   E. means for maintaining the pressure in the reaction chamber at a subatmospheric level as the gas is introduced.

6. In a chemical vapor deposition reactor for forming films of relatively uniform thickness on a plurality of generally planar substrate members:
   A. an axially elongated reaction chamber formed at least in part by an enclosing wall;
   B. heater means positioned outside the chamber for heating the chamber wall and the interior of the chamber;
   C. an axially extending distribution tube having a slightly greater diameter than the wafers and a plurality of axially spaced openings;
   D. means for holding the substrate members in an axially spaced relationship within the distribution tube with the major surfaces of the substrate members generally perpendicular to the axis of the chamber and the spacing between adjacent ones of the wafers at least as great as the distance between the edges of the wafers and the distribution tube;
   E. means for introducing a gaseous reactant into the chamber in the region between the chamber wall and the distribution tube for passage through the openings to the substrate members; and
   F. means for maintaining the pressure in the chamber at a subatmospheric level during introduction of the gaseous reactant.

7. The reactor of claim 6 wherein the heater means comprises a resistance heating coil positioned coaxially of the region in which the substrate members are held.

* * * * *